United States Patent [19]
Warner, Jr. et al.

[11] Patent Number: 5,855,076
[45] Date of Patent: Jan. 5, 1999

[54] LAYOUT TEMPLATE FOR TELECOMMUNICATIONS SWITCHING CABINETS

[75] Inventors: Robert Lee Warner, Jr., Royse City; Andre L. de la Garrigue, Allen, both of Tex.

[73] Assignee: Ericsson, Inc., Research Triangle Park, N.C.

[21] Appl. No.: 813,060

[22] Filed: Mar. 7, 1997

[51] Int. Cl.⁶ ................................................. G01B 5/16
[52] U.S. Cl. ................................................. 33/562; 33/1 G
[58] Field of Search .......................... 33/1 G, 526, 527, 33/562, 563; 52/105

[56] References Cited

U.S. PATENT DOCUMENTS

| | | | |
|---|---|---|---|
| 2,610,413 | 9/1952 | Dasey | 33/563 |
| 2,883,764 | 4/1959 | Stephens | 33/1 G |
| 4,266,388 | 5/1981 | Flood | 33/563 |
| 4,659,409 | 4/1987 | Arafat | 33/527 |
| 4,712,309 | 12/1987 | Kingston et al. | 33/562 |
| 5,323,541 | 6/1994 | Burnham | 33/562 |
| 5,396,713 | 3/1995 | Valdez | 33/562 |
| 5,655,330 | 8/1997 | Parsons, III | 52/105 |

*Primary Examiner*—G. Bradley Bennett
*Attorney, Agent, or Firm*—Rhodes, Coats & Bennett, L.L.P.

[57] ABSTRACT

A template system is provided for laying out the location of telecommunication switching cabinets in a switching center. The template system includes a plurality of fixture templates and a plurality of connector pieces for joining the fixture templates to one another. Each fixture template includes pre-formed marking holes and pre-formed marking slots to mark the layout of the cabinet. The marking holes are used to mark the location of mounting holes in the floor. Marking slots are used to mark the location of access openings for wiring in suspended floor systems. The connector pieces interlock with the fixture templates so that the fixture templates are always spaced a predetermined distance from one another. The interlocking fixture templates and connector pieces minimize the reliance on measurements thereby reducing the number of errors likely to occur when laying out the cabinets.

25 Claims, 7 Drawing Sheets

5,855,076

LAYOUT TEMPLATE FOR TELECOMMUNICATIONS SWITCHING CABINETS

FIELD OF THE INVENTION

The present invention relates generally to cabinets for telecommunications switching equipment, and more particularly, to a layout template for laying out the location of telecommunications switching cabinets.

BACKGROUND OF THE INVENTION

In a typical telecommunications switching center, the switching equipment is mounted in large cabinets anchored to the floor. The cabinet is supported by support feet which are spaced along the front and rear edges of the cabinet. The support feet are anchored by drilling holes in the floor and placing expansion anchors through the foot into the floor. After the holes are drilled in the floor, the cabinet, with the adjustable support feet attached, is placed where the holes in the floor correspond with the holes in the support feet. Bolts are then used to anchor the support feet to the floor, or threaded under floor structures, and nuts when using elevated floor systems.

One problem which has been encountered in the past when installing telecommunications switching cabinets is maintaining proper spacing between the support feet. A typical telecommunications switching cabinet has a series of mounting nuts which are welded to the bottom of the cabinet a fixed distance apart. The support feet are thread into these preset areas and are adjustable going up or down (used to level the cabinet). If the holes in the floor are measured incorrectly, the support feet will not anchor to the floor properly. Therefore it is important that the holes drilled into the floor are accurately located.

In the past, a floating template and measuring tape was used to locate the holes for the support feet in the floor. The floating template was shaped like the footprint of the cabinet and included pre-formed holes to mark the location of the holes for the support feet. The template would be located by measuring its distance from a known reference, such as a previously installed cabinet. Once the template was located, the holes for the support feet would be marked and drilled. This process would be repeated for each cabinet installed.

This method for laying out cabinets has a number of disadvantages. First, this method requires a great deal of care in making measurements to properly locate all of the support feet. Consequently, this method is relatively time consuming and costly. Further, no matter how much care is exercised, some measurement errors are bound to occur. When measurement errors do occur, the support feet will not be aligned properly and the cabinets cannot be anchored correctly. Consequently, it takes additional time to detect and correct the errors further increasing the cost of installing the cabinets. Furthermore, if holes are drilled incorrectly into concrete, the results can be devastating. If holes are drilled incorrectly into elevated floor systems, the floor could possibly be damaged beyond repair.

Accordingly, there is a need for an improved method of laying out telecommunications switching cabinets which decreases the time it takes to install the cabinets and reduces the number of errors.

SUMMARY OF THE INVENTION

The present invention provides a template system and method for using the same to simplify and speed up the installation of cabinets in a telecommunications switching center. The template system includes a plurality of main fixture templates and a plurality of connector pieces for joining the fixture templates together. The fixture templates roughly correspond in shape to the footprint of the switching cabinet and include pre-formed holes to locate the holes in the floor for the support feet. The connector pieces extend between and connect the fixture templates. The connector pieces interlock with the fixture templates so that the relative spacing between the templates will always be correct. Once the first template is located, the remaining templates can be located by simply connecting the template to a previously located template using the connector pieces. This method eliminates the need for taking measurements to locate each individual template thus speeding up the process while minimizing measurement errors.

DETAILED DESCRIPTION OF THE INVENTION

Figure 1:
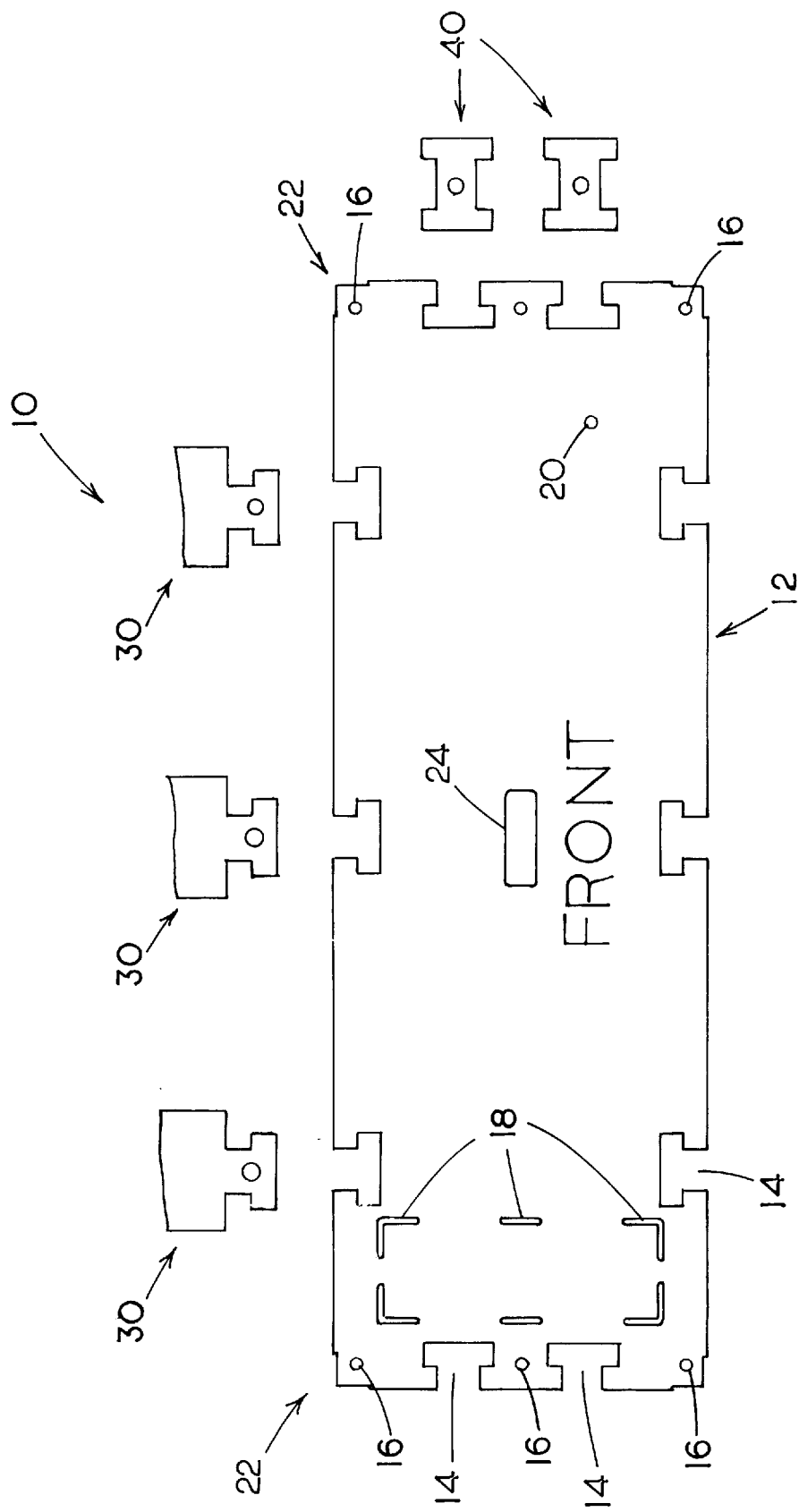
FIG. 1 is a top plan view of a fixture template which is used to locate the holes in a floor for the support feet of a telecommunication switching cabinet.

The present invention is described more fully hereinafter by referring to the drawings in which a preferred embodiment of the invention is depicted. However, it is understood that the present invention can take on many different embodiments and is not intended to be limited to the embodiments described herein.

Figure 2:
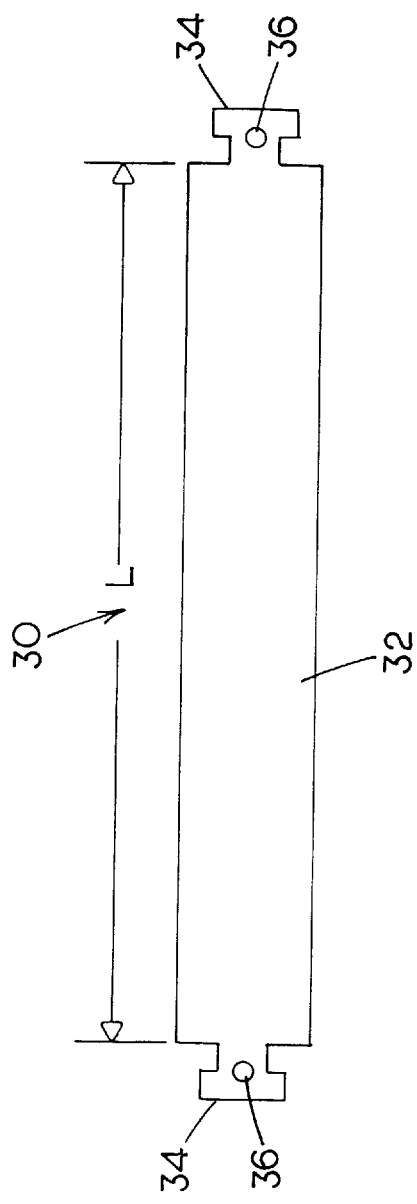
FIG. 2 is a top plan view of a long connector piece for joining two fixture templates together.
Figure 3:
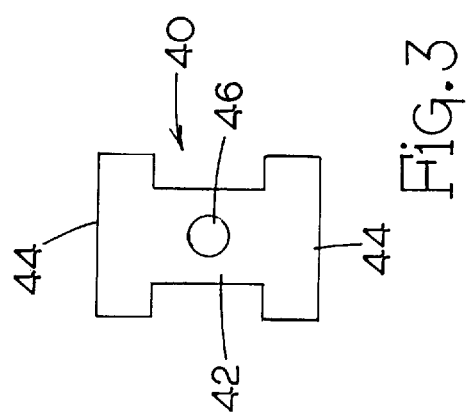
FIG. 3 is a top plan view of a short connector piece for joining two fixture templates together.

Referring now to FIGS. 1 through 3, the template system 10 of the present invention is shown. The template system 10 comprises a plurality of fixture templates 12 and a plurality of connector pieces 30 and 40. As will be hereinafter described in detail, the connector pieces 30 and 40 extend between and join two fixture templates 12 to maintain the proper spacing relationship between the fixture templates 12.

The fixture template 12 is shown in FIG. 1. The fixture template 12 has a generally rectangular configuration. The length and width of the template corresponds to the footprint of the cabinet. For example, the AXE 1200 cabinet manufactured by Ericsson, Inc. has a footprint of 400 mm×1200 mm. The fixture template 12 for this cabinet would therefore have a length of 1200 mm and a width of 400 mm (see FIG. 1). The AXE 720 cabinet manufactured by Ericsson, Inc. has a footprint of 400 mm×720 mm. The fixture template 12 for this cabinet would therefore have a length of 720 mm and a width of 400 mm (see FIG. 6).

The fixture template 12 has a series of T-shaped cut-outs 14 along each of its four sides. The three cut-outs 14 are formed along the front and back sides of the fixture template 12. Two cut-outs 14 are formed in each end of the fixture template 12. The cut-outs 14 are shaped to interlock with the connector pieces 30 and 40 as will be hereinafter described. While T-shaped cut-outs 14 are shown in the preferred embodiment, other interlocking geometries could also be used. For example, dovetail or trapezoidal shaped cut-outs 14 could be used instead of the T-shaped cut-outs 14.

Three pre-formed marking holes 16 are formed adjacent to each end of the fixture template 12. The marking holes 16 adjacent to the corners of the fixture template 12 are used to locate the holes in the floor for the support feet of the cabinet. The holes 16 located at the center of each side are used to locate the holes in the floor for a center bar which is used in seismically active regions. When a center bar is not being used, the center hole 16 along each side would not be used.

Adjacent to the left end of the fixture template 12 (as shown in FIG. 1), there are six boundary marking slots 18 which collectively define a rectangle. The slots 18 are used to mark the outline of an access opening in the floor which will be subsequently made for electrical wiring when the cabinet is mounted to a suspended floor and the wiring is run beneath the floor.

A small hole 20 is formed near the right end (as shown in FIG. 1) of fixture template 12. The purpose of hole 20 is to mark the center of a hole which is subsequently made in the floor for the ground wiring. This feature is also used when the cabinets are mounted on a suspended floor and the wiring is run beneath the floor.

Figure 7:
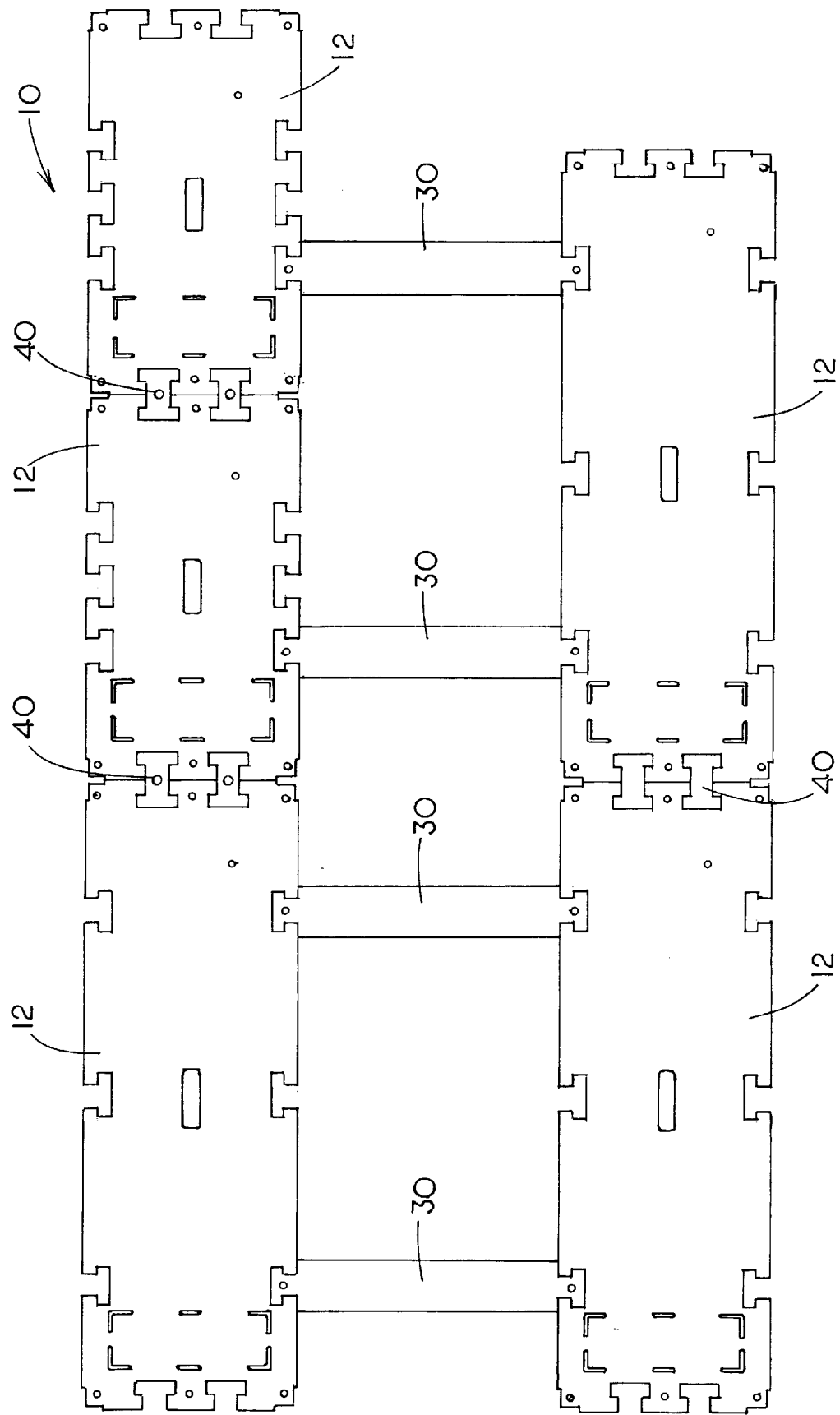
FIG. 7 is a top plan view showing a plurality of fixture templates arranged in two rows joined together by the connector pieces.

In another aspect of the present invention, the corners of the fixture template 12 are recessed as indicated by the numeral 22. The corner recesses 22 extend around each of the four corners of the fixture template 12. The reason for the corner recesses 22 is to allow the corners of the template 12 to be marked on the floor in a manner which allows the markings to be subsequently concealed. Since the corners are recessed, the markings applied to the floor will be within the footprint of the cabinet and thus concealed once the cabinet is installed. Also, when four templates are connected together a cross (+) is formed at the intersection making marking easy (see FIG. 7).

A rectangular opening 24 is formed at the center of the fixture template 12. The purpose of the rectangular opening 24 is to provide a handhold for carrying the fixture template 12. It will be readily apparent to those skilled in the art that a plurality of fixture templates 12 can be stacked one upon the other and carried by inserting the fingers of one hand through the openings 24 in the stacked fixture templates 12.

In a preferred embodiment of the invention, some indicia is placed on the top surface of the template 12 to indicate the proper orientation of the template. For example, the template shown in FIG. 1 has the word "FRONT" printed on the top surface of template 12 to indicate the front side of template 12.

Referring now to FIG. 2, a long connector piece 30 is shown. The connector piece 30 includes a center portion 32 of pre-determined length L and a pair of end portions 34. The end portions 34 are sized and shaped to fit into the cut-outs 14 in the fixture template 12. Thus, in the described embodiment, the end portions 34 have a generally T-shaped configuration. This shape will vary depending upon the shape of the cut-outs 14 in the fixture template 12.

The length of the center portion 32 corresponds to the desired spacing between rows of cabinets. For example, when cabinets are installed on a concrete floor, it is typical to space the rows 800 mm apart. Therefore, the length L of the center portion 32 would be 800 mm. When the cabinets are installed on a suspended floor system, it is typical to space the cabinets 1029 mm apart. In this case, the length L of the center portion 32 would be 1029 mm.

A finger hole 36 is formed adjacent to each end of connector piece 30. The purpose of the finger hole 36 is to make it easier to "pick-up" the connector piece 30 off the floor.

Figure 5:
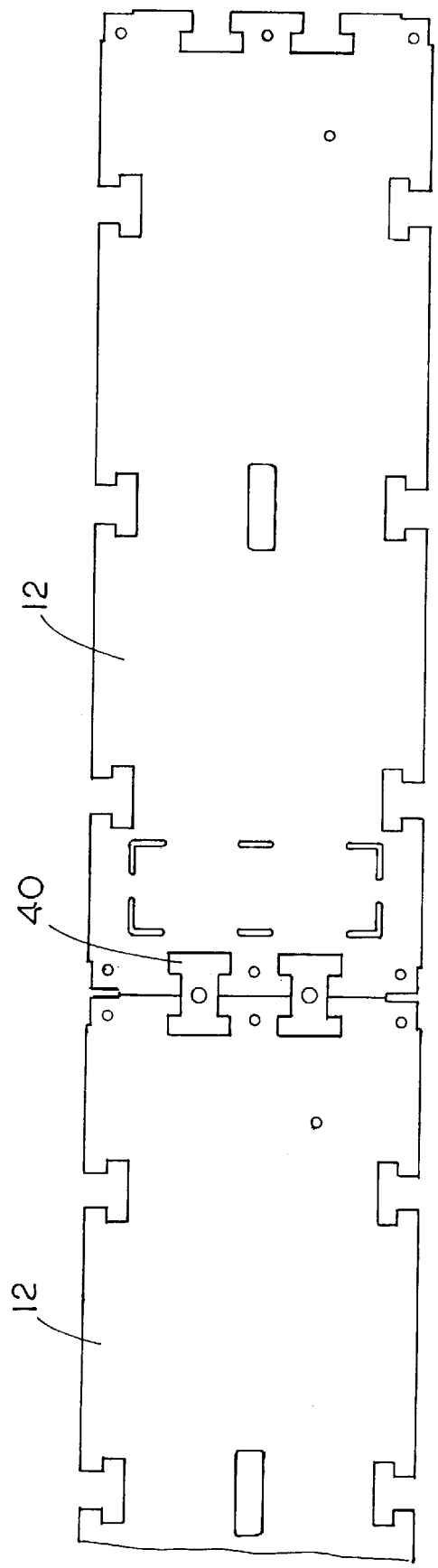
FIG. 5 is a top plan view of two fixture templates joined together using the short connector pieces.

Referring now to FIG. 3, a short connector piece 40 is shown. The short connector piece 40 includes a center portion 42 and end portions 44. The I-shaped configuration of connector piece 40 corresponds to the shape of two cutouts 14 in the fixture template 12 when the fixture templates are placed in side-by-side relationship. The connector piece 40 is used to connect the fixture templates 12 in abutting, side-by-side relationship as shown in FIG. 5.

A finger hole 46 is formed at the center of the connector piece 40. The purpose of the finger hole 46 is to make it easier to pick-up the connector piece 40 off the floor.

In use, a first fixture template 12 is located by taking measurements from known reference points. The location of the fixture template 12 can then be marked by tracing the recessed corners of the template with a marker or pen. The location of the holes in the floor for the support feet and center bars are marked using the marking holes 16. If the cabinet is installed on a suspended floor system, the access openings in the floor is marked using the boundary marking slots 18 and the opening for the ground wire is marked using the hole 20.

Figure 4:
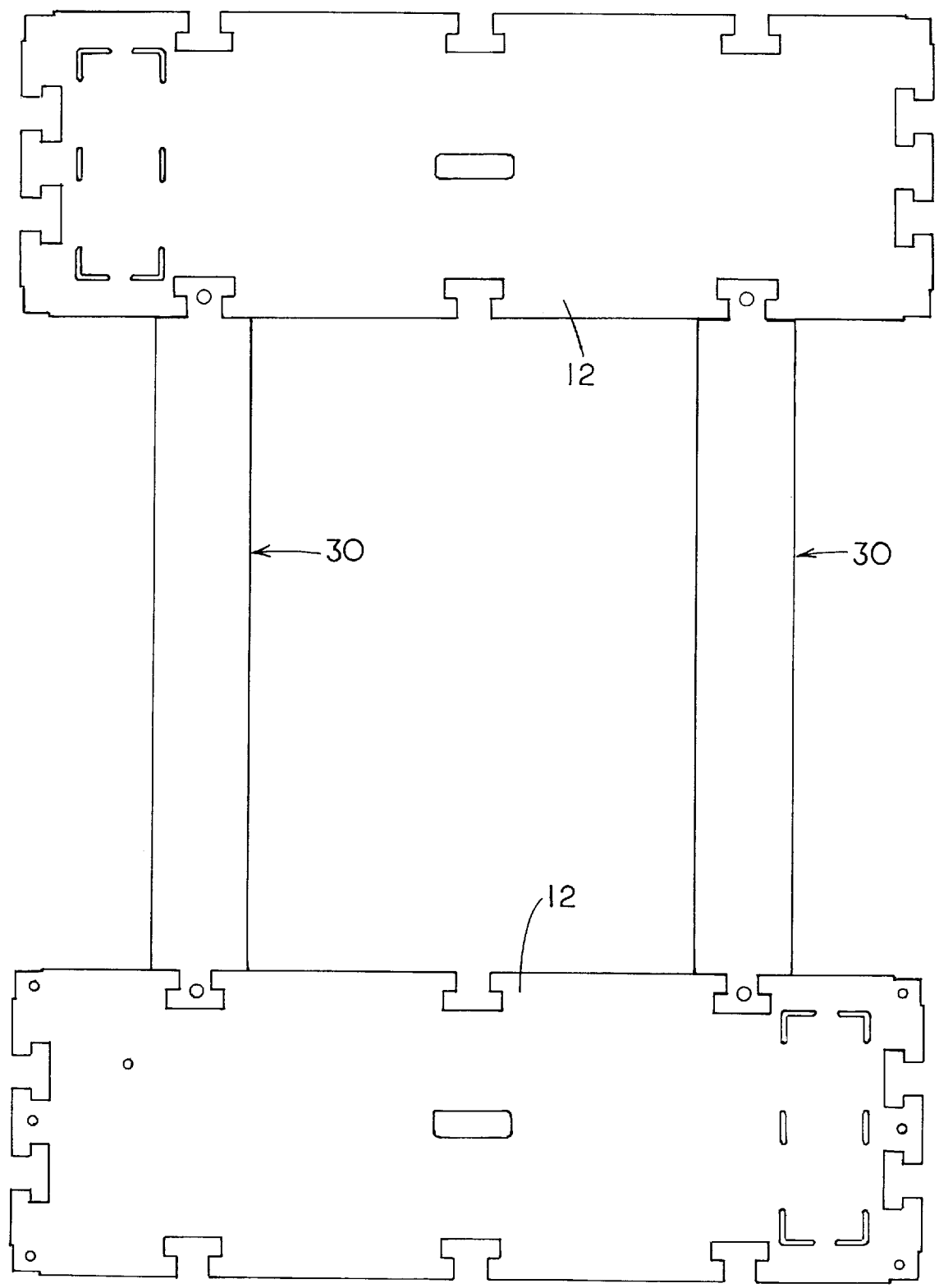
FIG. 4 is a plan view of two fixture templates joined together using the long connector pieces.

After the first template 12 is located, the other templates can be located by using the connector pieces 30 and 40. For example, as shown in FIG. 4, the long connector pieces 30 can be used to form an aisle between two cabinets. One end of each connector piece 30 is inserted into a cut-out 14 of the previously located fixture template 12. Once the connector pieces 30 are inserted into the first fixture template 12, the second fixture template 12 is fit onto the opposite ends of the connector pieces 30. Thus, the connector pieces 30 serve to maintain the proper spacing between the fixture templates 12 without the need for measurement. After each fixture template 12 is located, the location of the holes in the floor is marked as previously described.

As shown in FIG. 5, the short connector pieces 40 can be used to join two fixture templates 12 in abutting, side-by-side or end-to-end relationship. After the first template 12 is located, the second template is laid beside the first template so that the cut-outs 14 in the two templates align with one another. The connector pieces 40 are then inserted into the cut-outs 14 in the adjacent fixture templates 12. This process can be repeated to connect any desired number of fixture templates 12 together. After each fixture template 12 is located, the location of the holes in the floor is marked as previously described.

Figure 6:
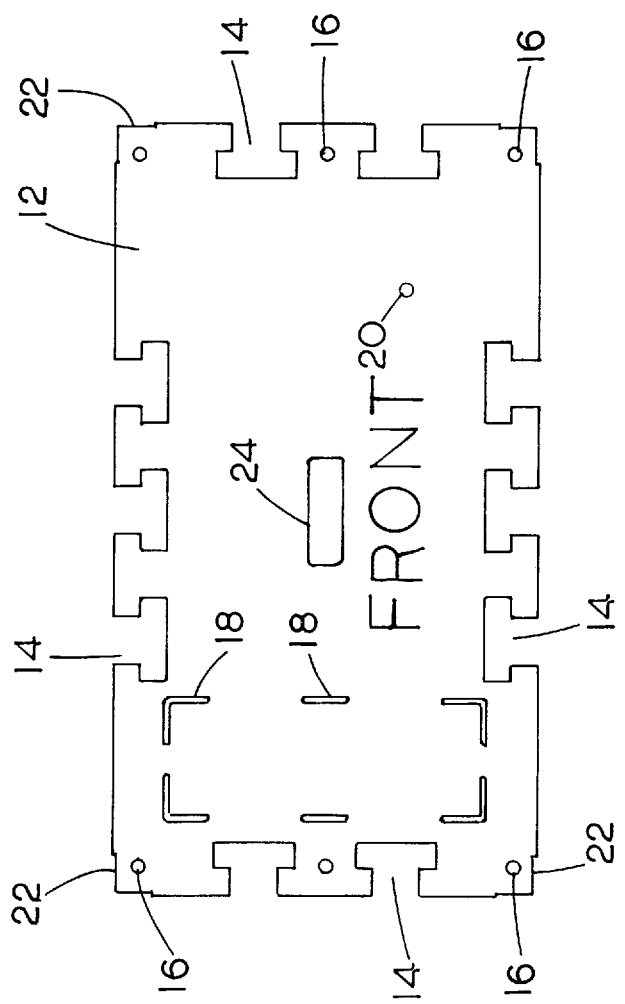
FIG. 6 is a top plan view of a second fixture template.

Referring now to FIG. 6, a second embodiment of the fixture template 12 is shown. The fixture template 12 shown in FIG. 6 is substantially the same as the fixture template 12 shown in FIG. 1. The fixture template 12 of FIG. 6 includes a plurality of cut-outs 14, pre-formed marking holes 16, marking slots 18, marking holes 20, corner recesses 22, and a center opening 24. These parts all perform the same functions as described in connection with the fixture template 12 of FIG. 1.

The fixture template 12 of FIG. 6 differs from the first embodiment only in size and location of the cut-outs 14. The fixture template 12 shown in FIG. 6 is shorter than the fixture template 12 shown in FIG. 1. Also, the cut-outs 14 are more closely spaced than in the first embodiment. The length of the fixture template 12 and spacing of the cut-outs 14 is selected so that when the templates 12 are arranged in parallel rows, at least one cut-out 14 on each template 12 will align with a cut-out 14 on a template 12 in a parallel row no matter what combination of templates 12 are used in each row. For example, FIG. 6 shows a plurality of fixture templates 12 arranged in two rows. One row includes one long and two short fixture templates 12. The parallel row includes two long fixture templates 12. Even though the fixture templates 12 in the first row are mixed, at least one cut-out 14 in each template 12 in the first row aligns with a cut-out 14 in a template 12 in the second row. This will always be the case no matter how the templates 12 are ordered in each row.

In order to make the cut-outs align, the length of the templates 12 and the spacing of the cut-outs 14 must be carefully selected. For example, the templates 12 shown in FIGS. 1 and 6 have a length of 1200 mm and 720 mm respectively. The spacing between cut-outs 14 for the template 12 of FIG. 1 is approximately 360 mm (measured center to center). The spacing between the cut-outs for the template 12 shown in FIG. 6 is approximately 120 mm. For both templates the outer cut-outs 14 are spaced approximately 240 mm from the ends of the template 12.

The fixture templates 12 and connector pieces 30, 40 are made of a rigid PVC foam board. A suitable material is a PVC foam board sold under the trademark Trovicel approximately ¼" thick. Different colors of foam board may be used for different components of the template system to make it easier to identify the appropriate template.

Figure 8:
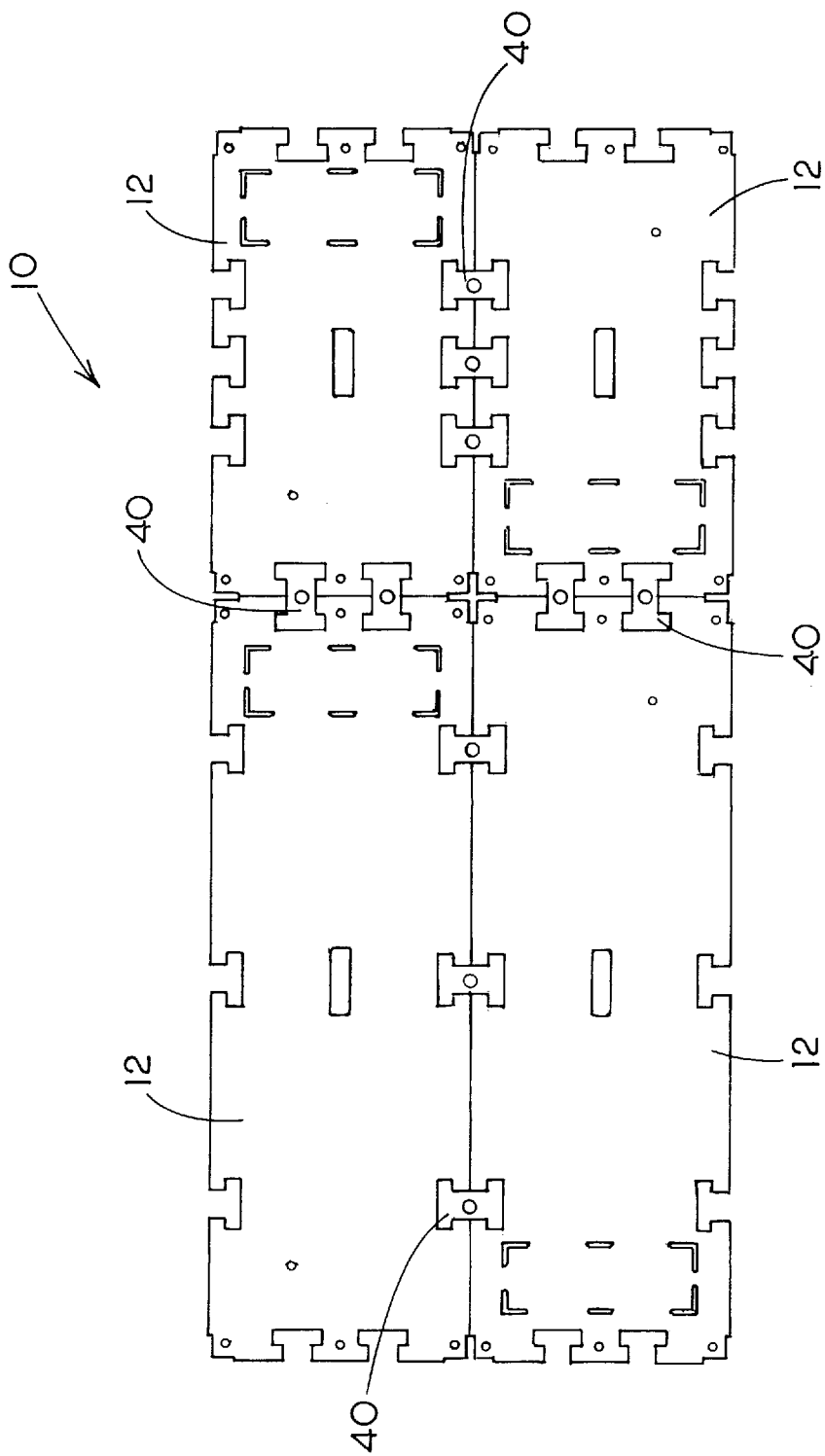
FIG. 8 is a top plan view showing a plurality of fixture templates arranged in two rows joined together by the connector pieces.

Referring now to FIG. 8, a group of four fixture templates 12 are shown connected together in abutting relationship using the short connectors 40. It should be noted that when four templates are placed together in this manner, the corner recesses 22 at the intersection of the four templates form a cross.

Based of the foregoing, it is apparent that the template system 10 of the present invention provides a fast and easy method for laying out the location of cabinets in a telecommunications switching center. The template system 10 of the present invention minimizes reliance on measurements which is a potential source of error. Further, the template system 10 of the present invention ensures proper spacing between the cabinets.

What is claimed is:
1. A template system for laying out a telecommunications switching cabinet comprising:
   (a) a plurality of fixture templates for marking the location of mounting holes in a floor to which the switching cabinet is secured, said fixture template including a plurality of pre-formed marking holes for marking the location of the mounting holes in the floor; and
   (b) a plurality of connector pieces for connecting two or more fixture templates such that the fixture templates are spaced a predetermined distance from one another.
2. The template system of claim 1 wherein said fixture templates and said connector pieces include interlocking geometries so that the connector pieces interlock with the fixture templates.
3. The template system of claim 2 wherein said fixture templates include a plurality of cut-outs and wherein said connector pieces include insert portions on opposing ends of the connector pieces which fit into the cut-outs in the fixture templates.
4. The template system of claim 3 wherein the cut-outs and the insert portions both have a generally T-shaped configuration.
5. The template system of claim 1 wherein the fixture template has a polygonal configuration with recessed corners for marking the location of the template of the floor.
6. The template system of claim 1 wherein said fixture template further includes a series of boundary marking slots for marking the outline of an access opening to be made in the floor.
7. The template system of claim 1 wherein said fixture template includes a hand-hold opening for carrying the fixture template.
8. The template system of claim 1 wherein said connector pieces include at least one finger hole to aid in picking the connector piece up off the floor.
9. A template system for laying out a telecommunications switching cabinet comprising:
   (a) a plurality of fixture templates for marking the location of mounting holes in a floor to which the switching cabinet is secured, said fixture template including:
      (1) a plurality of pre-formed marking holes for marking the location of the mounting holes; and
      (2) a plurality of cut-outs formed along at least one side of the fixture template;
   (b) a plurality of connector pieces for connecting two or more fixture templates such that the fixture templates are spaced a predetermined distance from one another, each connector piece including insert portions on opposing ends thereof that interlock with the cut-outs in the fixture templates.
10. The template system of claim 9 wherein the cut-outs and the insert portions both have a generally T-shaped configuration.
11. The template system of claim 9 wherein the fixture template has a polygonal configuration with recessed corners for marking the location of the template of the floor.
12. The template system of claim 9 wherein said fixture template further includes a series of boundary marking slots for marking the outline of an access opening to be made in the floor.
13. The template system of claim 9 wherein said fixture template includes a hand-hold opening for carrying the fixture template.
14. The template system of claim 9 wherein said connector pieces include at least one finger hole to aid in picking the connector piece up off the floor.
15. A method for laying out the location of mounting holes in a floor for a telecommunications switching cabinet, said layout method comprising:
   (a) providing a plurality of templates each having pre-formed marking holes for marking the location of the mounting holes for the switching cabinets;
   (b) providing a plurality of connector pieces for joining two or more templates a pre-determined distance apart;
   (c) locating a first template;
   (d) locating a second template by joining the second template to the first template with said connector pieces; and
   (e) marking the location of the mounting holes using the marking holes in said fixture template.
16. The cabinet layout method of claim 15 wherein said fixture templates include a series of cut-outs and wherein the connector pieces interlock with the cut-outs in the fixture template.
17. The cabinet layout method of claim 15 where in said fixture templates include recessed corners for marking the location of the corners of the cabinet, and wherein said layout method includes the step of marking the corner locations of the cabinet.

18. The cabinet layout method of claim 15 wherein said fixture templates include a series of boundary marking slots for marking an outline for an access opening in a floor, and wherein said layout method includes the step of marking the location of said access opening.

19. A template system for laying out a telecommunications switching cabinet comprising:

(a) a plurality of first fixture templates having a first pre-determined length;

(b) a plurality of second fixture templates having a second predetermined length;

(c) a plurality of cut-outs formed along the sides of said first and second fixture templates;

(d) a plurality of first connector pieces which fit into the cut-outs in said first and second fixture templates for joining said fixture templates in abutting, end-to-end relationship to form a row of templates; and (e) a plurality of second connector pieces which fit into the cut-outs in said first and second fixture templates for joining said fixture templates in parallel spaced relationship.

20. The template system according to claim 19 wherein said cut-outs in said first and second fixture templates are spaced along the sides of said first and second templates such that at least one cut-out in each of said templates in a first row of templates will always align with a cut-out in a template in a parallel row of templates when any combination of first and second templates is used in said parallel row.

21. The template system of claim 19 wherein the cut-outs and the insert portions both have a generally T-shaped configuration.

22. The template system of claim 19 wherein the fixture template has a polygonal configuration with recessed corners for marking the location of the template of the floor.

23. The template system of claim 19 wherein said fixture template further includes a series of boundary marking slots for marking the outline of an access opening to be made in the floor.

24. The template system of claim 19 wherein said fixture template includes a hand-hold opening for carrying the fixture template.

25. The template system of claim 19 wherein said connector pieces include at least one finger hole to aid in picking the connector piece up off the floor.

* * * * *